United States Patent [19]
Ugajin et al.

[11] Patent Number: 5,332,952
[45] Date of Patent: Jul. 26, 1994

[54] QUANTUM PHASE INTERFERENCE TRANSISTOR

[75] Inventors: Ryuichi Ugajin; Akira Ishibashi, both of Kanagawa, Japan

[73] Assignee: Sony Corporation, Tokyo, Japan

[21] Appl. No.: 957,530

[22] Filed: Oct. 7, 1992

Related U.S. Application Data

[62] Division of Ser. No. 819,492, Jan. 10, 1992, Pat. No. 5,204,588.

[30] Foreign Application Priority Data

| Dec. 22, 1990 | [JP] | Japan | 2-413323 |
| Jan. 14, 1991 | [JP] | Japan | 3-014727 |
| Jan. 18, 1991 | [JP] | Japan | 3-018328 |
| Jan. 23, 1991 | [JP] | Japan | 3-022779 |
| Jan. 31, 1991 | [JP] | Japan | 3-031643 |

[51] Int. Cl.$^5$ .................................. H01J 11/04
[52] U.S. Cl. .................... 315/349; 313/309; 313/336
[58] Field of Search ............ 315/349, 309, 336, 351; 313/309, 336

[56] References Cited

U.S. PATENT DOCUMENTS

| 4,893,156 | 1/1990 | Karasawa | 357/23.1 |
| 5,012,153 | 4/1991 | Atkinson | 313/336 |
| 5,017,231 | 5/1991 | Nishihara | 106/452 |
| 5,063,426 | 11/1991 | Chandrasekhar | 257/197 |
| 5,204,588 | 4/1993 | Ugajn et al. | 315/349 |

Primary Examiner—Robert J. Pascal
Assistant Examiner—Reginald A. Ratliff
Attorney, Agent, or Firm—Hill, Steadman & Simpson

[57] ABSTRACT

Disclosed is hererin a quantum phase interference transistor comprising: an emitter for emitting electron waves into a vacuum; a gate electrode for controlling the phase difference between a plurality of electron waves; and a collector for collecting the electron waves; characterized in that the gate electrode has the construction of a capacitor.

1 Claim, 15 Drawing Sheets

F I G. 4A
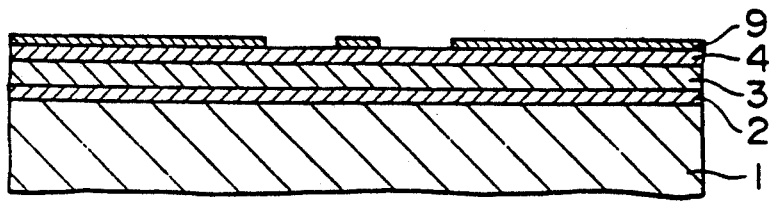
F I G. 4B
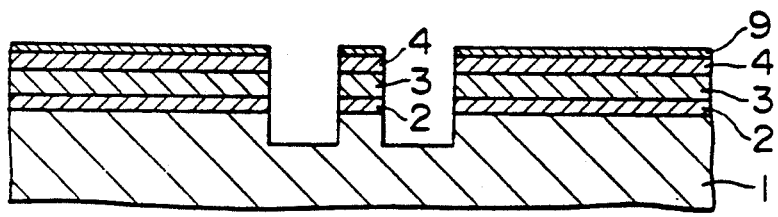
F I G. 4C
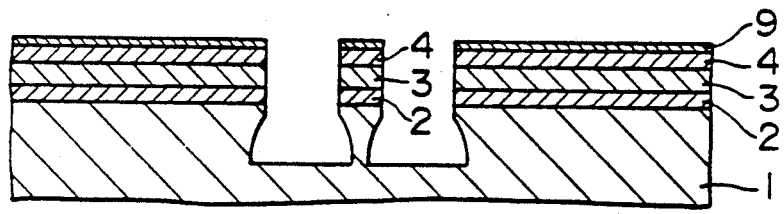
F I G. 4D
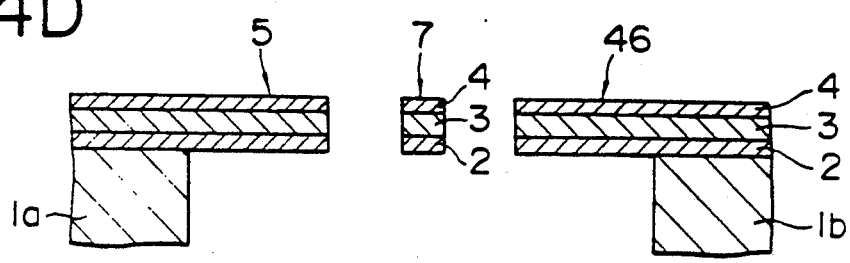

F I G. 19A 
F I G. 19B 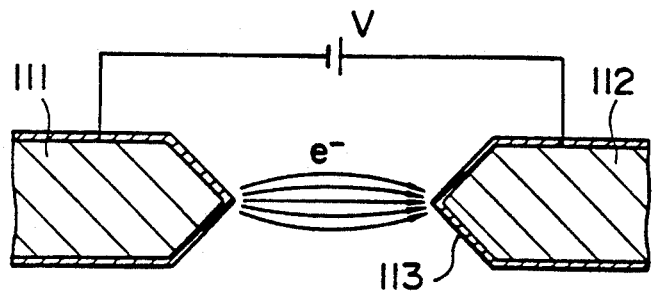
F I G. 19C 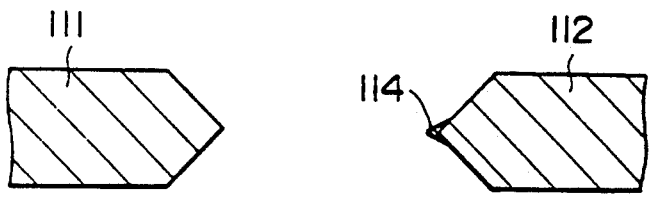
F I G. 19D 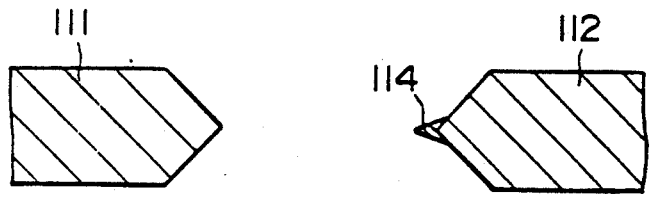
F I G. 19E 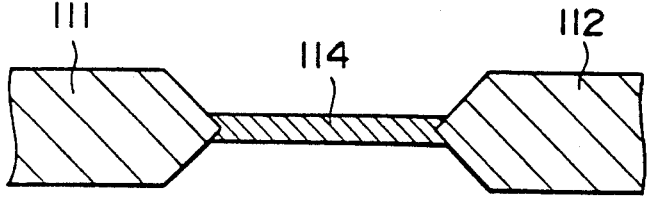

QUANTUM PHASE INTERFERENCE TRANSISTOR

This is a division of application Ser. No. 07/819,492, filed Jan. 10, 1992, now U.S. Pat. No. 5,204,588.

BACKGROUND OF THE INVENTION

1. Field of the Invention

The present invention relates to a transistor based on the principle of vacuum microelectronics and, more particularly, to a quantum phase interference transistor.

2. Description of the Prior Art

Recent progress in microstructure fabricating techniques has activated studies of electron wave interference devices utilizing the coherence of electron waves. An electron wave interference transistor utilizing the Aharonov-Bohm effect (hereinafter referred to as "AB effect transistor") employing AlGaAs/GaAs double heterojunction has been proposed in, for example, Technical Digest of IEDM 86, pp. 76-79. This previously proposed AB effect transistor, however, must be cooled at a very low temperature below the temperature of liquid helium (4.2° K.) to maintain the coherence of electrons. Therefore this AB effect transistor is difficult to apply to simple purposes and is disadvantageous in cost.

SUMMARY OF THE INVENTION

It is a first object of the present invention to provide a quantum phase interference transistor capable of efficiently using the variation of the interference pattern of electron waves caused by phase control as the variation of collector current.

A second object of the present invention is to provide a quantum phase interference transistor capable of operating at a room temperature at a high modulation efficiency and of increasing current that flows between the emitter and the collector.

A third object of the present invention is to provide a quantum phase interference transistor based on vacuum microelectronics, capable operating at a room temperature, and having a sufficiently high quantum-mechanical transition probability modulating efficiency.

A fourth object of the present invention is to provide a quantum phase interference transistor capable of operating at a room temperature and of readily emitting electrons from the emitter.

A fifth object of the present invention is to provide a selective growth method capable of readily fabricating an electron emitting source capable of operating at high efficiency.

A sixth object of the present invention is to provide a selective growth method capable of readily forming a fine line of a very small diameter supported at support portions in suspension.

BRIEF DESCRIPTION OF THE DRAWINGS

FIGS. 4A to 4D are sectional views of a method of fabricating the quantum phase interference transistor shown in FIGS. 1 and 2;

FIGS. 19A to 19E are sectional views of assistance in explaining a method of fabricating a quantum phase interference transistor in a sixth embodiment according to the present invention.

DETAILED DESCRIPTION OF THE PREFERRED EMBODIMENTS

Figure 1:
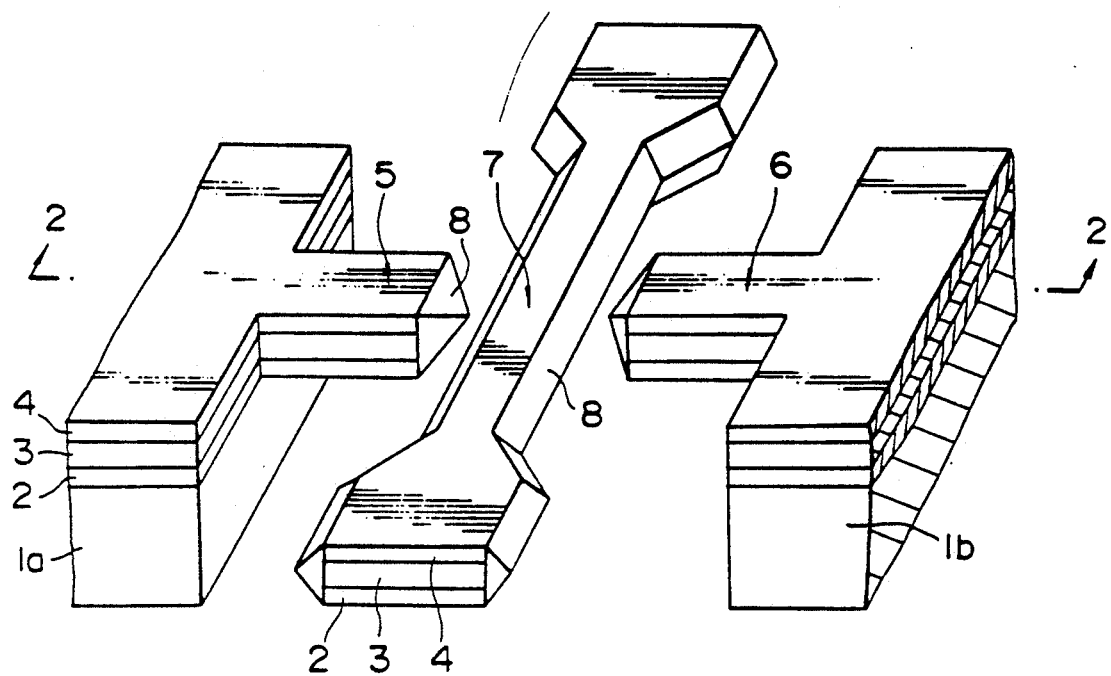
FIG. 1 is a perspective view of a quantum phase interference transistor in a first embodiment according to the present invention.

Quantum phase interference transistors in preferred embodiments according to the present invention will be described hereinafter with reference to the accompanying drawings, in which the same or corresponding parts are denoted by the same reference characters.

Figure 2:
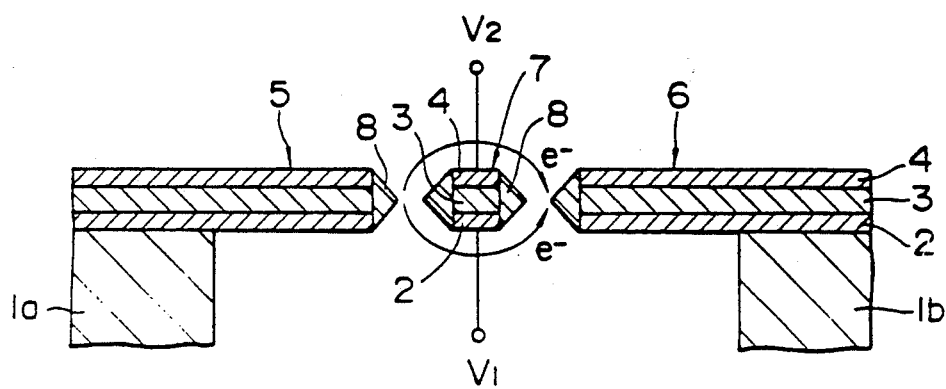
FIG. 2 is a sectional view of the quantum phase interference transistor shown in FIG. 1.

FIG. 1 is a perspective view of a quantum phase interference transistor in a first embodiment according to the present invention, and FIG. 2 is a sectional view taken on line 2—2 in FIG. 1.

Referring to FIGS. 1 and 2, the quantum phase interference transistor in the first embodiment according to the present invention has supports $1a$ and $1b$ formed opposite to each other with a predetermined space therebetween on, for example, a semi-insulating GaAs substrate, not shown. An n-type GaAs layer 2, a semi-insulating GaAs layer 3 and an n-type GaAs layer 4 are formed sequentially in that order on each of the supports $1a$ and $1b$.

The n-type GaAs layer 2, the semi-insulating GaAs layer 3 and the n-type GaAs layer 4 formed on the support $1a$, and those formed on the support $1b$ form projections projecting from the respective opposite side surfaces thereof toward each other. The projection projecting from the n-type GaAs layer 2, the semi-insulating GaAs layer 3 and the n-type GaAs layer 4 formed on the support $1a$ is an emitter 5, and the projection projecting from those formed on the support $1b$ is a collector 6. The emitter 5 and the collector 6 have the shape of, for example, a quadrangular prism, and their center axes are in alignment with each other. The size of the cross section of each of the emitter 5 and the collector 6 is, for example, about 5000 Å × about 5000 Å.

A gate electrode 7 is extended perpendicularly to a straight line connecting the emitter 5 and the collector 6. The gate electrode 7 has a narrower middle portion, and wider opposite ends. The gate electrode 7 is supported in suspension at its opposite ends on supports, not shown. The gate electrode 7 is symmetrical with respect to the straight line connecting the emitter 5 and the collector 6. The gate electrode 7 has a parallel flat capacitor construction consisting of an n-type GaAs layer 2, a semi-insulating GaAs layer 3 and an n-type GaAs layer 4. The conductive n-type GaAs layers 2 and 4 serves as electrodes. The surfaces of the n-type GaAs layers 2 and 4 serving as electrodes are parallel to the straight line connecting the emitter 5 and the collector 6.

The emitter 5 and the collector 6 have tips having the shape of, for example, a quadrangular pyramid and formed of a semi-insulating GaAs layer 8. The sharp points of the tips of semi-insulating GaAs layers 8 of the emitter 5 and the collector 6 are opposite to each other. Semi-insulating GaAs layers 8 are formed on the opposite sides of the gate electrode 7.

The operation of the quantum phase interference transistor thus constructed will be described hereinafter.

In this quantum phase interference transistor, the potential of the collector 6 is higher than that of the emitter 5. Suppose that the respective potentials of the n-type GaAs layer 2 and the n-type GaAs layer 4 of the gate electrode 7, i.e., the electrodes of a parallel flat capacitor, are $V_1$ and $V_2$, and the mean of the potentials $V_1$ and $V_2$, i.e., $(V_1+V_2)/2$, is negative relative to the potential of the emitter 5. Then, the gate electrode 7 acts as a blocker to electron waves emitted from the emitter 5 into a vacuum. Consequently, the electron waves emitted into a vacuum by field emission from the emitter 5 are divided into an electron wave traveling over the gate electrode 7 to the collector 6 and an electron wave traveling under the gate electrode 7 to the collector 6, as viewed in FIGS. 1 and 2.

The phase difference between the two electron waves is dependent on the difference between the respective potentials $V_1$ and $V_2$ of the n-type GaAs layer 2 and the n-type GaAs layer 4, i.e., the electrodes of the parallel flat capacitor forming the gate electrode 7. Therefore, interference between the two electron waves on the collector 6 is controlled by controlling the phase difference between the two electron waves by the difference between the potentials $V_1$ and $V_2$. Thus, the quantum-mechanical transition probability of the electrons traveling from the emitter 5 to the collector 6 is modulated for transistor action.

A method of fabricating the quantum phase interference transistor in the first embodiment according to the present invention will be described hereinafter.

First an etching process employed in the method will be described. In etching, for example, a GaAs substrate by a dry etching process, such as a reactive ion etching process, using an etching gas, such as $CCl_2F_2$, the GaAs substrate is etched in a direction perpendicular to its surface when the etching gas is supplied at a relatively low flow rate, and then the GaAs substrate is etched laterally when the flow rate of the etching gas is increased. The rate of lateral etching is dependent on crystal orientation.

Figure 3A:
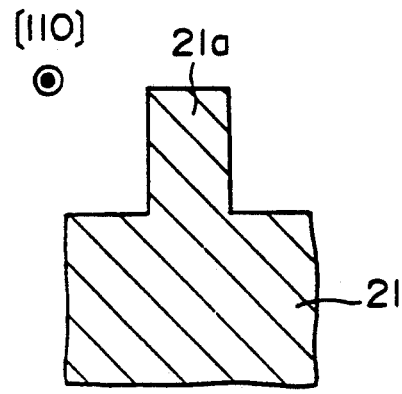
FIGS. 3A to 3C are sectional views of assistance in explaining an etching process in a method of fabricating the quantum phase interference transistor shown in FIGS. 1 and 2.
Figure 3B:
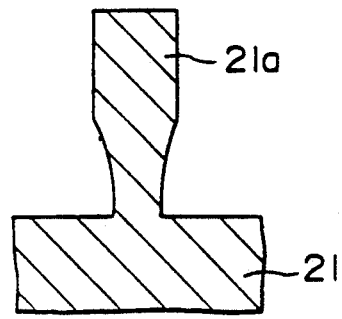
Figure 3C:
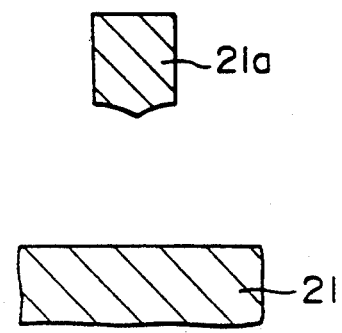

FIGS. 3A to 3C show steps of forming a stripe extending along the direction of [1 1 0] on a (0 0 1) semi-insulating GaAs substrate 21 by a dry etching process.

As shown in FIG. 3A, in forming the stripe on the semi-insulating GaAs substrate 21 by a dry etching process using a mask, not shown, the semi-insulating GaAs substrate 21 is etched in a direction perpendicular to its surface in both directions [1 1 0] and [1 −1 0] while the flow rate of the etching gas is relatively low, so that a stripe $21a$ is formed.

When the flow rate of the etching gas is increased for successive dry etching, the etching rate with respect to the direction [1 −1 0] is higher than the etching rate with respect to the direction [1 1 0] and, consequently, the side surfaces of the stripe $21a$ are etched laterally as shown in FIG. 3B.

When the etching process is continued further, the stripe $21a$ is separated from the semi-insulating GaAs substrate 21 as shown in FIG. 3C. The backside of the stripe $21a$ extending in the direction [1 1 0] is formed of Ga, and the surface formed of Ga is hard to etch.

Thus, the etching rate for the stripe $21a$ extending in the direction [1 1 0] is different from the etching rate for a stripe extending in the direction [1 −1 0]. Therefore, when the straight line connecting the emitter 5 and the collector 6 of the quantum phase interference transistor shown in FIGS. 1 and 2 extends in the direction [1 1 0] and the gate electrode 7 extends in the direction [1 −1 0], i.e., the direction perpendicular to the direction [1 1 0], the gate electrode 7 is formed in a thickness smaller than that of the emitter 5 and the collector 6. Accordingly, the symmetry of the gate electrode with respect to the straight line connecting the emitter 5 and the collector 6 is deteriorated, and hence the symmetry of the path of electrons traveling over the gate electrode 7 and the path of electrons traveling under the gate electrode 7 is deteriorated. Consequently, the interference between the electron wave traveling over the gate electrode 7 and the electron wave traveling under the gate electrode 7 is deteriorated and, consequently, the modulation efficiency of the gate electrode 7 is deteriorated.

Accordingly, the method of fabricating the quantum phase interference transistor in the first embodiment forms the emitter 5 and the collector 6 on the (0 0 1) semi-insulating GaAs substrate so that the straight line connecting the emitter 5 and the collector 6 extends in the direction [1 0 0], and the gate electrode 7 extends in the direction [0 1 0] perpendicular to the straight line. Thus, the gate electrode 7 can be formed symmetrically with respect to the straight line connecting the emitter 5 and the collector 6. It is also possible to form the emitter 5 and the collector 6 so that the straight line connecting the emitter 5 and the collector 6 extends in the direction [0 1 0] and the gate electrode 7 extends in the direction [1 0 0].

Referring to FIG. 4A, an n-type GaAs layer 2, a semi-insulating GaAs layer 3 and an n-type GaAs layer 4 are formed sequentially in that order on a semi-insulating GaAs substrate 1 by epitaxial growth by, for example, a metal organic chemical vapor deposition process (MOCVD process). Then, a mask, such as an aluminum film, having a pattern corresponding to an emitter, a collector and a gate electrode to be formed is formed over the n-type GaAs layer 4. Then, the work, namely, the semi-insulating GaAs substrate 1 coated with the laminate layer of the n-type GaAs layer 2, the semi-insulating GaAs layer 3 and the n-type GaAs layer 4, coated with the mask 9, is subjected to, for example, a RIE process for dry etching to form a stripe corresponding to a gate electrode 7 as shown in FIG. 4B.

Then, the flow rate of the etching gas is increased for further dry etching to etch the lower portion of the stripe laterally as shown in FIG. 4C. The RIE process is continued further until the gate electrode 7 supported in suspension at its opposite ends, and the emitter 5 and the collector 6 projecting toward each other respectively from the supports 1a and 1b are formed. Thus, the gate electrode 7 is symmetrical with respect to a straight line connecting the emitter 5 and the collector 6. Then, the mask 9 is removed.

Then, semi-insulating GaAs layers 8 are formed on the respective tips of the emitter 5 and the collector 6 and on the opposite side surfaces of the gate electrode 7 as shown in FIGS. 1 and 2 by epitaxial growth by, for example, a MOCVD process. The semi-insulating GaAs layers 8 are formed in the shape of a quadrangular pyramid on the tips of the emitter 5 and the collector 6. Thus the quantum phase interference transistor is completed.

Since the gate electrode 7 has the construction of a parallel flat capacitor, the potentials of spaces over and under, respectively, of the gate electrode 7 are fixed and hence there is no potential difference between the paths of electrons traveling over and under the gate electrode 7. Accordingly, the efficiency of modulation of the quantum-mechanical transition probability of electrons from the emitter 5 to the collector 6 is sufficiently high.

Furthermore, since electrons travel through a vacuum in the quantum phase interference transistor in the first embodiment, the quantum phase interference transistor is capable of operating at a room temperature. Still further, since the gate electrode 7 is symmetrical with respect to the straight line connecting the emitter 5 and the collector 6, the path of electrons traveling over the gate electrode 7 and the path of electrons traveling under the gate electrode 7 are satisfactorily symmetrical. Accordingly, the interference between the electron wave traveling over the gate electrode 7 and the electron wave traveling under the gate electrode 7 is satisfactory. Thus, the gate electrode 7 further enhances the modulation efficiency.

Incidentally, the quantum phase interference transistor in the first embodiment controls the phase difference between the electron waves traveling over and under, respectively, the gate electrode 7 by the potential difference between the electrodes of the parallel flat capacitor forming the gate electrode 7 to modulate the quantum-mechanical transition probability of electrons traveling from the emitter 5 to the collector 6. However, a relatively long time is necessary for charging the parallel flat capacitor forming the gate electrode 7 and hence, in some cases, the quantum phase interference transistor is unable to operate at a sufficiently high operating speed. This problem can be solved by utilizing the finite resistance R of the semi-insulating GaAs layer 3 formed between the electrodes of the gate electrode 7.

Figure 5:
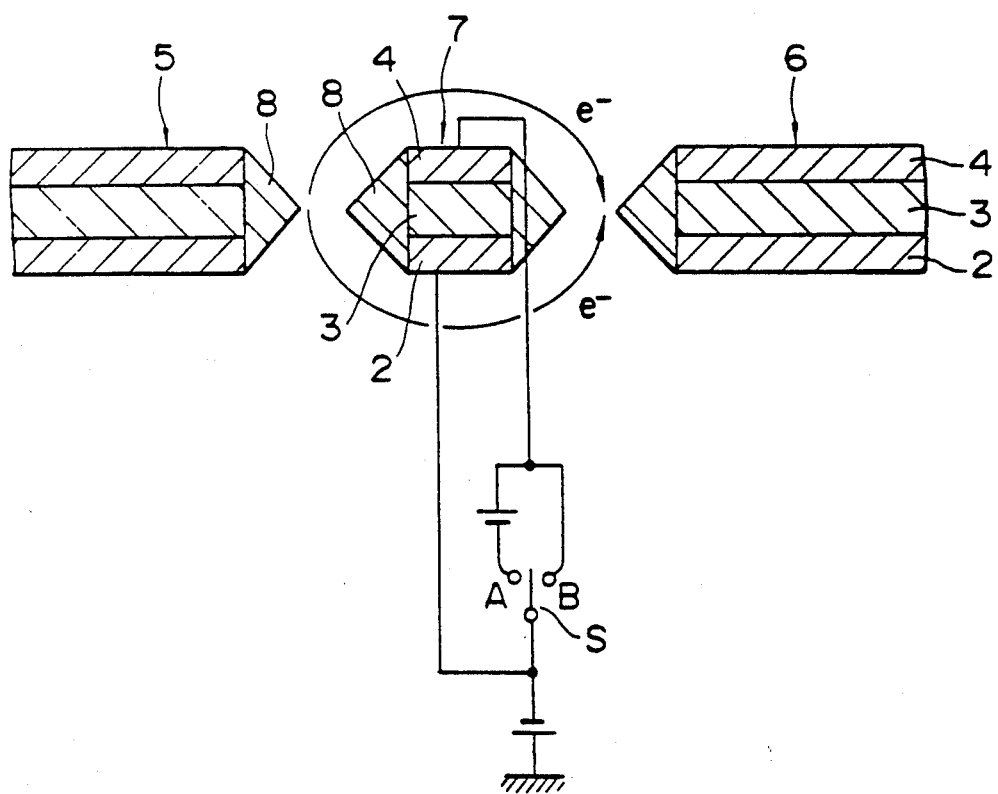
FIG. 5 is an enlarged fragmentary sectional view of assistance in explaining a modulation system employed by the quantum phase interference transistor shown in FIGS. 1 and 2.

The n-type GaAs layer 2 and the n-type GaAs layer 4 of the gate electrode 7 is connected by a circuit including a switch S as shown in FIG. 5. When the movable contact of the switch S is connected to a contact B, no current flows between the n-type GaAs layers 2 and 4 of the gate electrode 7 and hence there is no potential difference between the n-type GaAs layers 2 and 4. When the movable contact of the switch S is connected to a contact A, a current I flows from the n-type GaAs layer 4 to the n-type GaAs layer 2 and thereby the potential difference IR is created between the n-type GaAs layers 2 and 4. The phase difference between the electron wave traveling over the gate electrode 7 and the electron wave traveling under the gate electrode 7 is controlled by this potential difference IR.

The time required for the potential difference between the opposite sides of the semi-insulating GaAs layer acting as a resistor to reach a fixed potential difference is far shorter than the time necessary for charging the capacitor, so that modulation by the gate electrode 7 can be achieved rapidly. Thus, the gate electrode 7 having the construction of a parallel flat capacitor ensures a high modulation efficiency to enable the quantum phase interference transistor to operate at a high operating speed.

Figure 6:
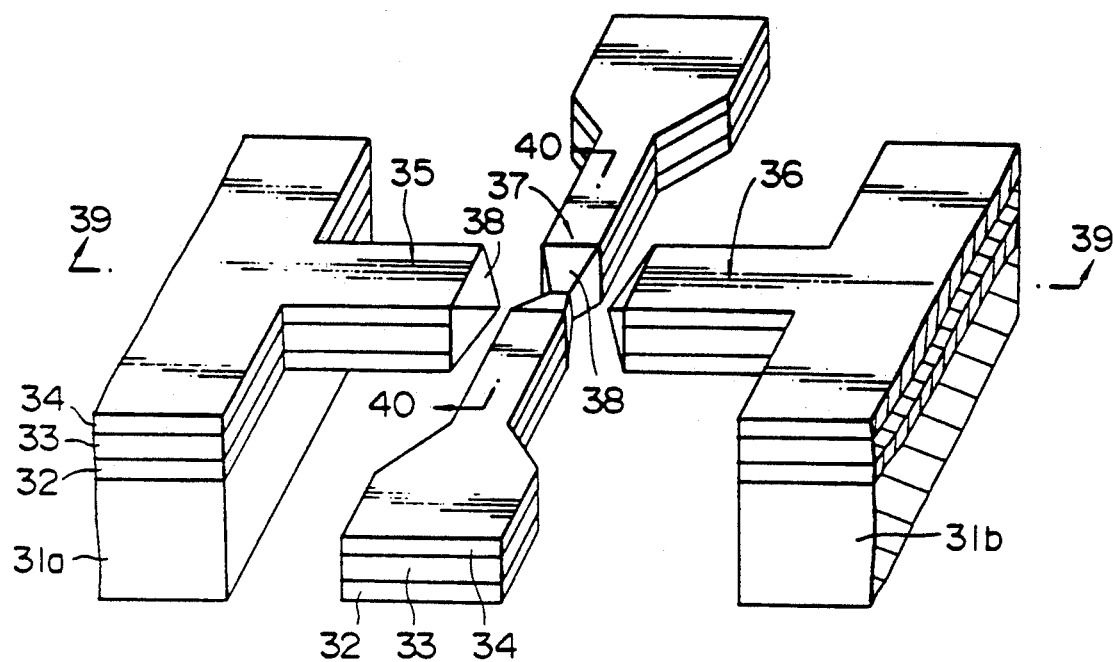
FIG. 6 is a perspective view showing the construction of a quantum phase interference transistor in a second embodiment according to the present invention.
Figure 7:
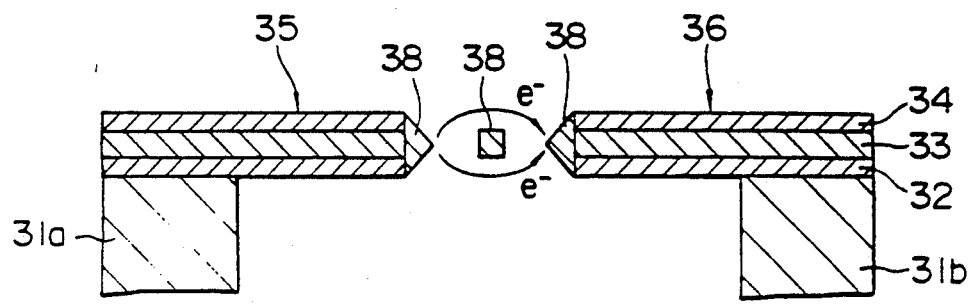
FIG. 7 is a sectional view of the quantum phase interference transistor shown in FIG. 6.
Figure 8:
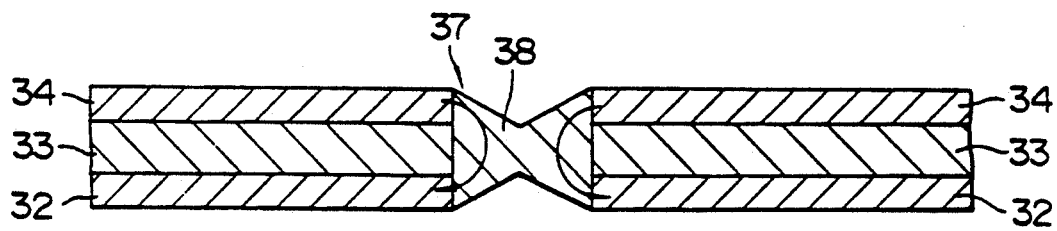
FIG. 8 is an enlarged fragmentary sectional view of assistance in explaining a modulation system employed by the quantum phase interference transistor shown in FIGS. 6 and 7.

FIG. 6 is a perspective view of a quantum phase interference transistor in a second embodiment according to the present invention, FIG. 7 is a sectional view taken on line 9—9 in FIG. 6, and FIG. 8 is an enlarged fragmentary sectional view taken on line 10—10 in FIG. 6.

Referring to FIGS. 6, 7 and 8, the quantum phase interference transistor in the second embodiment according to the present invention has an emitter 35, a collector 36 and a gate electrode 37. A portion of the gate electrode 37 lying between the emitter 35 and the collector 36 is formed of, for example, a semi-insulating GaAs layer 38. The size of the sectional area of the semi-insulating GaAs layer 38 decreases gradually toward the intersection of a straight line connecting the emitter 35 and the collector 36 and the longitudinal center axis of the gate electrode 37, and the semi-insulating GaAs layer 38 is divided at the intersection into two parts lying with their tips having the shape of a quadrangular pyramid facing opposite to each other. The quantum phase interference transistor in the second embodiment is the see in the rest of details of construction as the quantum phase interference transistor in the first embodiment.

A method of fabricating the quantum phase interference transistor in the second embodiment will be described hereinafter.

Figure 9:
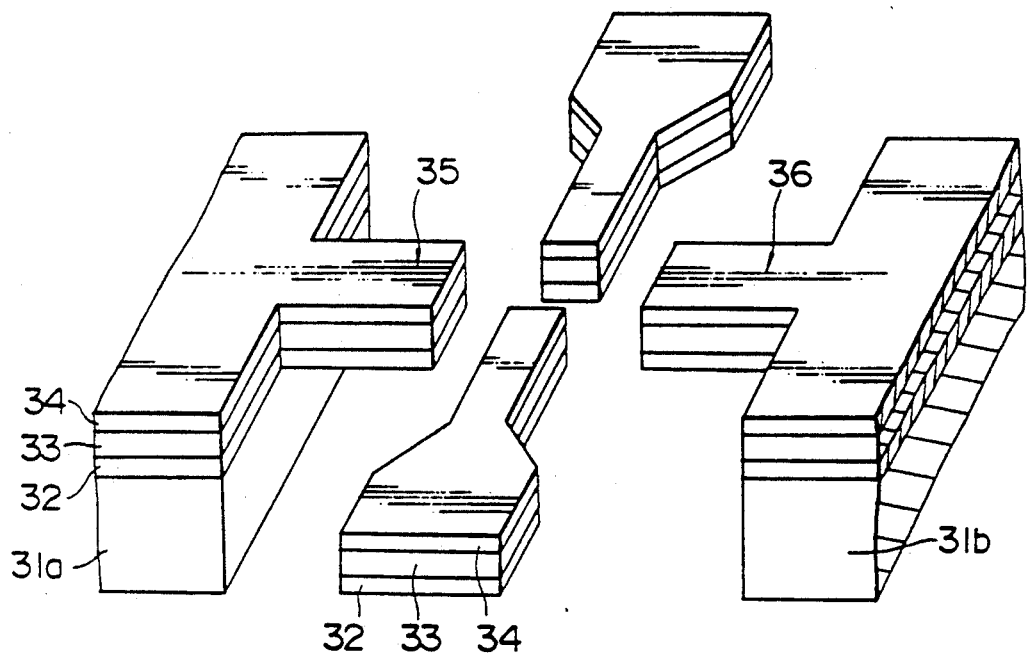
FIG. 9 is a perspective view of assistance in explaining a method of fabricating the quantum phase interference transistor shown in FIGS. 6 and 7.

First a structure as shown in FIG. 9 is formed by an etching process similar to that employed in fabricating the quantum phase interference transistor in the first embodiment. The size of the cross section of a pair of projections forming the emitter 35 and the collector 36 may be, for example, about 5000 Å×about 5000 Å, and the interval between the tips of the pair of projections may be on the order of 8000 Å.

Then, a semi-insulating GaAs layer is formed over the entire surface by epitaxial growth by, for example, a MOCVD process. Semi-insulating GaAs layers 38 are formed on the tips of the pair of projections in the shape of a quadrangular pyramid by the MOCVD process. The height of the semi-insulating GaAs layers 38 formed in the shape of a quadrangular pyramid on the tips of the projections is, for example, on the order of 2500 Å. Semi-insulating GaAs layers 38 are formed likewise on the opposite tips of projections for the gate electrode 37 and, finally, the semi-insulating GaAs layers 38 become continuous Thus, a portion of the gate electrode 37 formed between the emitter 35 and the collector 36 is formed of the semi-insulating GaAs layer 38 as shown in FIGS. 6, 7 and 8. The size of the cross section of the narrowest portion of the semi-insulating GaAs layer 38 is determined selectively by selectively determining the time for epitaxial growth.

Figure 10:
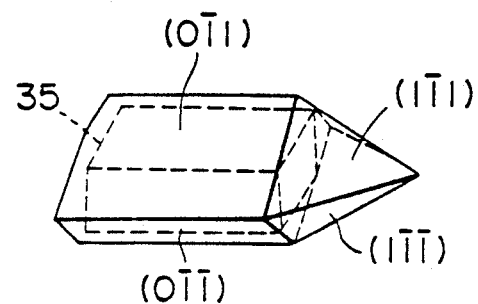
FIG. 10 is a perspective view of assistance in explaining epitaxial growth on the tip of the emitter of a quantum phase interference transistor.

When the epitaxial growth of the semi-insulating GaAs is continued over a predetermined time, a semi-insulating GaAs layer 38 is formed on the tip of the projection forming the emitter 35 as shown in FIG. 10. The side surfaces of the semi-insulating GaAs layer 38 formed in the shape of a quadrangular pyramid on the tip of the projection for the emitter 35 are (1 −1 1) faces and (1 −1 −1) faces, and the side surfaces of the semi-insulating GaAs layer 38 formed over the side surfaces of the projection are (0 −1 1) faces and (0 −1 −1) faces. The angle of the tip of the semi-insulating GaAs layer 38 formed on the tip of the projection in the shape of a quadrangular pyramid is about 90° with respect to the direction of the center axis of the projection, namely, the direction [1 0 0]. The same conditions apply to the semi-insulating GaAs layer 38 formed on the projection for the collector 36.

In the quantum phase interference transistor in the second embodiment, a current is supplied, for example, from the n-type GaAs layer 34 through the semi-insulating GaAs layer 38 having a finite resistance to the n-type GaAs layer 32 as indicated by an arrow in FIG. 10 to create a potential difference between the n-type GaAs layer 34 and the n-type GaAs layer 32. The phase difference between the electron wave traveling over the gate electrode 37 and the electron wave traveling under the gate electrode 37 can be controlled by the phase difference.

Since the portion of the gate electrode 37 lying between the emitter 35 and the collector 36 can be formed in a cross section having a relatively small size, the emitter 35 and the collector 36 can be formed with a relatively small interval on the order of several thousands angstroms therebetween; consequently, the interference between the electron wave traveling over the gate electrode 37 and the electron wave traveling under the gate electrode 37 can be enhanced, the modulation efficiency of the gate electrode 37 can be enhanced, the rate of collection of electrons emitted from the emitter 35 by the collector 36 can be increased and hence the current flowing between the emitter 35 and the collector 36 can be increased. Furthermore, since the interval between the emitter 35 and the collector 36 is reduced, the voltage applied across the emitter 35 and the collector 36 can be reduced accordingly, and hence the quantum phase interference transistor is able to operate at reduced power consumption.

In the first and second embodiments, either or both of the n-type GaAs layers forming the electrodes of the parallel flat capacitor may be formed of a p-type GaAs layer, and the semi-insulating GaAs layer formed between the electrodes of the parallel flat capacitor forming the gate electrode may be formed of a substance having a finite resistance other than the semi-insulating GaAs.

A quantum phase interference transistor in a third embodiment according to the present invention will be described hereinafter.

Figure 11:
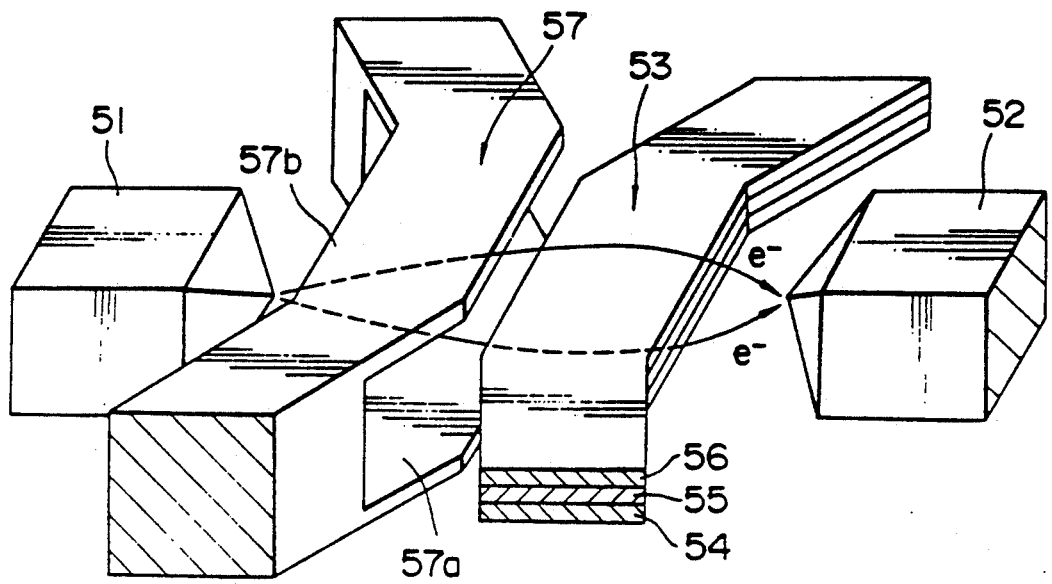
FIG. 11 is a perspective view of a quantum phase interference transistor in a third embodiment according to the present invention.
Figure 12:
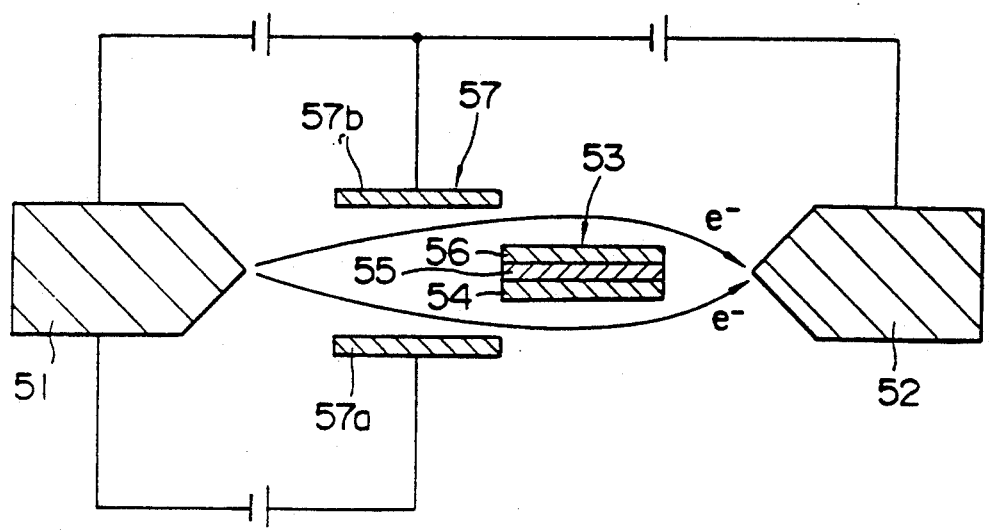
FIG. 12 is a sectional view of the quantum phase interference transistor shown in FIG. 11.

FIG. 11 is a perspective view of the quantum phase interference transistor in the third embodiment according to the present invention, and FIG. 12 is a sectional view taken on line 2—2 in FIG. 11.

Referring to FIGS. 11 and 12, the quantum phase interference transistor in this embodiment has an emitter 51 having the shape of a quadrangular prism with a pointed tip having the shape of a quadrangular pyramid, and a collector 52 having the shape of a quadrangular prism with a pointed tip having the shape of a quadrangular pyramid. The emitter 51 and the collector 52 are formed on a substrate, such as a semi-insulating GaAs substrate, not shown, with their tips facing each other and with their center axes in alignment with each other. The emitter 51 and the collector 52 are formed of, for example, GaAs. The size of the emitter 51 and the collector 52 is, for example, about 0.5 μm×about 0.5 μm.

A gate electrode 53 is supported at its opposite ends on supports, not shown, in suspension. The middle portion of the gate electrode 53 corresponding to the emitter 51 and the collector 52 is perpendicular to a line connecting the emitter 51 and the collector 52. The end portions of the gate electrode 53 on the opposite sides of the middle portion are bent toward the collector 52.

the gate electrode 53 has a laminate construction, similar to the construction of a parallel flat capacitor, consisting of, for example, an n-type GaAs layer 54, a semi-insulating GaAs layer 55 and an n-type GaAs layer 56. The n-type GaAs layer 54 and the n-type GaAs layer 56 serve as electrodes. The n-type GaAs layer 54, the semi-insulating GaAs layer 55 and the n-type GaAs layer 56 are parallel to the line connecting the emitter 51 and the collector 52. The width of the gate electrode 53 along the line connecting the emitter 51 and the collector 52 is, for example, on the order of 0.5 μm.

In this embodiment, a pulling-out electrode 57 is formed between the emitter 51 and the gate electrode 53. The middle portion of the pulling-out electrode 57 corresponding to the emitter 51 and the collector 52 is perpendicular to the line connecting the emitter 51 and the collector 52 and parallel to the gate electrode 53. The end portions on the opposite sides of the middle portion of the pulling-out electrode 57 consists of a lower pulling-out electrode 54a and an upper pulling-out electrode 54b, which are spaced by an opening. The width of the upper pulling-out electrode 54b and the lower pulling-out electrode 54a along the line connecting the emitter 51 and the collector 52 is, for example, on the order of 0.5 μm.

The operation of the quantum phase interference transistor thus constructed will be described hereinafter.

A voltage is applied across the emitter 51 and the collector 52 of the quantum phase interference transistor so that the potential of the collector 52 is higher than that of the emitter 51. A voltage high enough to obtain field emission from the emitter 51 is applied across the emitter 51 and the pulling-out electrode 57 so that the potential of the pulling-out electrode 57 is higher than that of the emitter 51, namely, so that the pulling-out electrode 57 is biased positively relative to the emitter 51. Thus, the emitter 51 emits electron waves, and the lower pulling-out electrode 57a and the upper pulling-out electrode 57b biased positively relative to the emitter 51 divides electron waves into an electron wave that travels over the gate electrode 53 to the collector 52 and an electron wave that travels under the gate electrode 53 to the collector 52 as shown in FIGS. 11 and 12.

The phase difference between the two electron waves is dependent on the difference between the potential $V_1$ of the n-type GaAs layer 54 of the gate electrode t3 and the potential $V_2$ of the n-type GaAs layer 56 of the gate electrode 3. The difference between the potentials $V_1$ and $V_2$ is controlled to control the interference between the two electron waves through the control of the phase difference between the two electron waves. thus, the quantum-mechanical transition probability of the electrons traveling from the emitter 51 to the collector 52 is modulated for transistor operation.

A method of fabricating the quantum phase interference transistor in this embodiment thus constructed will be described hereinafter with reference to sectional views taken on line 52—52 in FIG. 11.

Figure 13A:
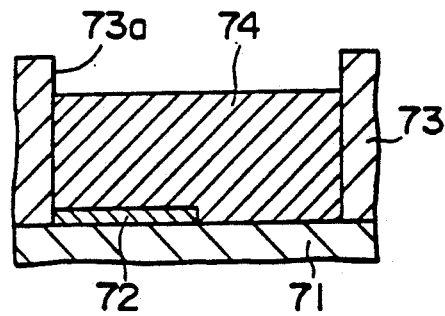
FIGS. 13A to 13J are sectional views of assistance in explaining a method of fabricating the quantum phase interference transistor shown in FIGS. 11 and 12.

First, as shown in FIG. 13A, an n-type GaAs layer 72 is formed in a shape corresponding to that of the pulling-out electrode 57 on, for example, a semi-insulating GaAs substrate 71. The n-type GaAs layer 72 is formed, for example, by forming an epitaxial n-type GaAs layer over the entire surface of the semi-insulating GaAs substrate 71 by a metal organic chemical deposition process (MOCVD process), and by etching the n-type GaAs layer in a desired pattern. Then, a resist film 73 having an aperture 73a corresponding to an area in which the gate electrode 63 and the pulling-out electrode 67 are to be formed is formed by lithography, and a $SiO_2$ film 74 is formed in the aperture 73a of the resist film 73.

Figure 13B:
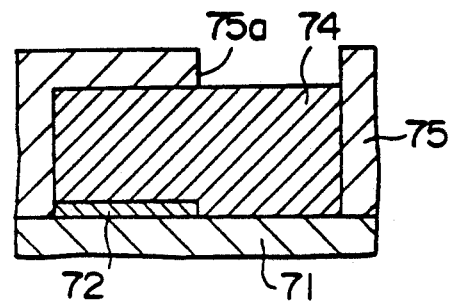

Then, the resist film 13 is removed and a resist film 75 having an aperture 75a corresponding to an area in which the gate electrode 63 is to be formed is formed as shown in FIG. 13B.

Figure 13C:
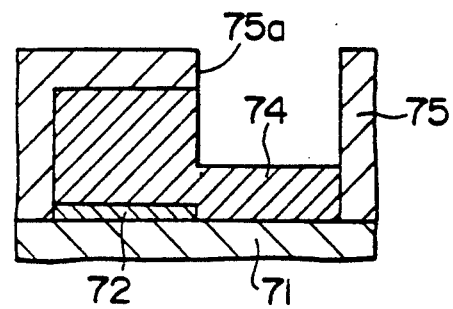

Then, the $SiO_2$ film 74 is etched perpendicularly to the surface of the substrate by, for example, a reactive ion etching process (RIE process), using the resist film 75 as a mask to remove the $SiO_2$ film partially as shown in FIG. 13C. The surface of the etched portion of the $SiO_2$ film 74 is flush with the lower surface of the gate electrode 63.

Figure 13D:
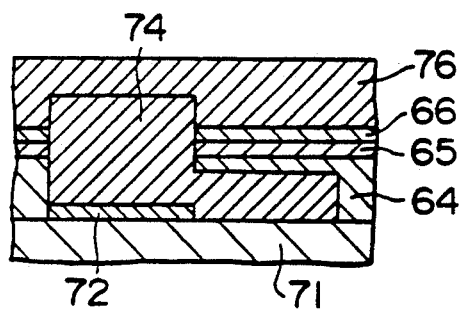

Subsequently, the resist film 75 is removed, an n-type GaAs layer 64, a semi-insulating GaAs layer 65 and an n-type GaAs layer 66 are formed sequentially by an epitaxial growth process, and then the surface of the work is coated entirely with, for example, a $SiO_2$ film 76 as shown in FIG. 13D.

Figure 13E:
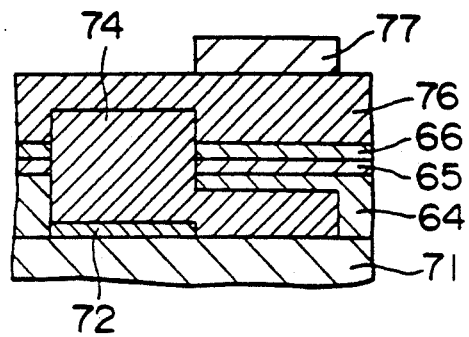

Then, as shown in FIG. 13E, a resist film 77 is formed over the $SiO_2$ film 76 in a pattern corresponding to the shape of the gate electrode 63.

Figure 13F:
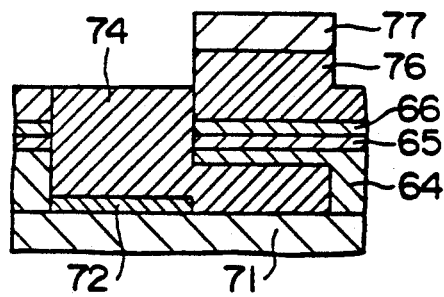

Then, the resist film 76 is etched perpendicularly to the surface of the substrate, using the resist film 77 as a mask to remove the $SiO_2$ film 76 partially as shown in FIG. 13F.

Figure 13G:
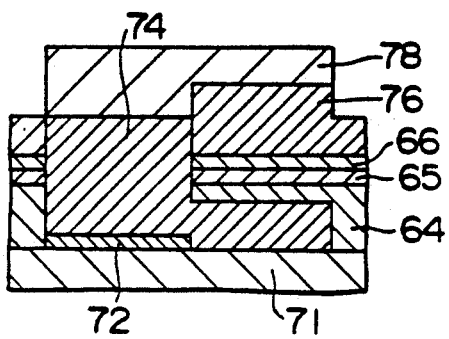

Then, the resist film 77 is removed and a resist film 78 is formed in a pattern corresponding to the shapes of the gate electrode 63 and the pulling-out electrode 67 as shown in FIG. 13G.

Figure 13H:
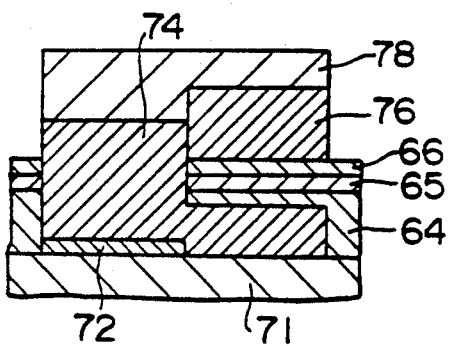

Then, the $SiO_2$ film is etched perpendicularly to the surface of the substrate, using the resist film 78 as a mask to remove the $SiO_2$ film partially as shown in FIG. 13H.

Figure 13I:
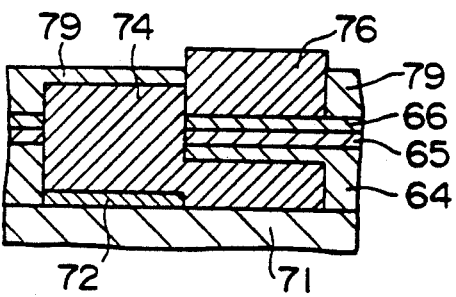

Subsequently, the resist film 78 is removed and an n-type GaAs layer 79 is formed by an epitaxial growth process so that the upper surface of the n-type GaAs layer 79 is flush with the pulling-out electrode 67 as shown in FIG. 13I.

Then, a resist film, not shown, is formed over the n-type GaAs layer 79 and the $SiO_2$ film 76 in a pattern corresponding to the gate electrode 63 and the pulling-out electrode 67, and the n-type GaAs layer 79 is etched perpendicularly to the surface of the substrate to remove the n-type GaAs layer 79 partially, using the resist film as a mask.

Figure 13J:
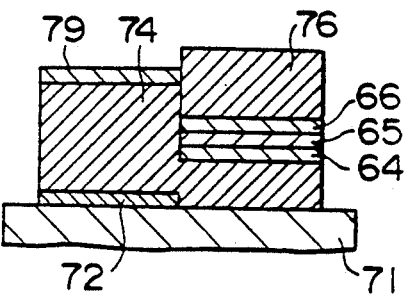

Then, the resist film is removed to obtain a work in a state as shown in FIG. 13J. Then, the $SiO_2$ films 74 and 76 are removed by a wet etching process to form the gate electrode and the pulling-out electrode as shown in FIGS. 11 and 12.

The emitter 61 and the collector 62 are formed either before or after forming the gate electrode 63 and the pulling-out electrode 67. The emitter 61 and the collector 62 are formed by forming a pair of protrusions having the shape of a quadrangular prism opposite to each other, and forming tip portions having the shape of a quadrangular pyramid on the opposite ends of the pair or protrusions, respectively, by an epitaxial growth process.

In the quantum phase interference transistor in this embodiment, the lower pulling-out electrode 67a and the upper pulling-out electrode 67b formed between the emitter 61 and the gate electrode 63 make the emitter 61 emit electron waves and divide the electron waves into an electron wave traveling over the gate electrode 63 and an electron wave traveling under the gate electrode 63. Accordingly, the quantum phase interference transistor need not be provided with a negatively biased blocker for electron waves emitted by the emitter 61 into two electron waves, and hence the reduction of the intensity of the electric field in the vicinity of the emitter 61 can be obviated. Therefore, electrons are easy to be emitted from the emitter 61.

Furthermore, since the emitter 61 and the pulling-out electrode 64 can be formed so that the distance therebetween is as small as, for example, about 1500 Å by the combined application of dry etching techniques and epitaxial growth techniques and hence it is possible to make the emitter 61 emit electrons by field emission by applying a relatively low voltage across the emitter 61 and the pulling-out electrode 67.

Since the gate electrode 63 has the construction of a parallel flat capacitor, the respective potentials of the upper and lower sides of the gate electrode 63 can be held constant. therefore, there is no potential difference between the electron path extending over the gate electrode 63 and the electron path extending under the gate electrode 63 and the quantum-mechanical transition probability modulation efficiency is sufficiently high.

Since the gate electrode 63 can be formed in a very small thickness, the curvature of the electron paths extending between the emitter 61 and the collector 62 is not very large. Therefore, the collector 62 is able to collect the electrons emitted from the emitter 61 at a comparatively high collecting efficiency.

Since the electrons travel through a vacuum the quantum phase interference transistor in this embodiment is able to operate at a room temperature.

The gate electrode 63 having the construction of a parallel flat capacitor may be substituted by a gate electrode of a construction other than the construction of a parallel flat capacitor.

Thus, the pulling-out electrode is disposed between the emitter and the gate electrode to make the emitter emit electron waves and to divide the electron waves into a plurality of electron waves. Accordingly, the quantum phase interference transistor is capable of operating at a room temperature and electrons are easy to be emitted from the emitter.

A quantum phase interference transistor in a fourth embodiment according to the present invention will be described hereinafter Referring to FIG. 14, the quantum phase interference transistor in the fourth embodiment according to the present invention has an emitter 81 having the shape of, for example, a quadrangular prism with a tip having the shape of a quadrangular pyramid formed on, for example, a semi-insulating GaAs substrate, not shown. A portion having the shape of the quadrangular prism of the emitter 81 has a cross section of, for example, about 0.5 $\mu$m $\times$ about 0.5 $\mu$m. A collector 82 is formed opposite to the emitter 81. The collector 82 is a fine metal line of a thin metal film having a sufficiently small thickness and a small width. Indicated at 83 is an insulating film, such as a $SiO_2$ film, and at 84 and 85 are external electrodes.

A gate electrode 86 and a blocker 87 are formed between the emitter 81 and the collector 82. The gate electrode 86 and the blocker 87 are supported at their opposite ends on supports, not shown, so that their middle portions are in suspension. Portions of the gate electrode 86 and the blocker 87 extending between the emitter 81 and the collector 82 are perpendicular to a line connecting the emitter 81 and the collector 82.

The gate electrode 86 has the laminate construction of a parallel flat capacitor consisting of, for example, an n-type GaAs layer 86a, a semi-insulating GaAs layer 86b and an n-type GaAs layer 86c. The n-type GaAs layer 86a and the n-type GaAs layer 86c serve as electrodes. The n-type GaAs layer 86a and the n-type GaAs layer 86c, i.e., the electrodes, are parallel to the line connecting the emitter 81 and the collector 82. The width of the gate electrode 86 along the line connecting the emitter 81 and the collector 82 is, for example, on the order of 0.5 $\mu$m.

The operation of the quantum phase interference transistor thus constructed will be described hereinafter.

Suppose that the respective potentials of the n-type GaAs layer 86a and the n-type GaAs layer 86c of the gate electrode 86, i.e., the electrodes of a parallel flat capacitor, of the quantum phase interference transistor in this embodiment are $V_1$ and $V_2$, and the mean of the potentials $V_1$ and $V_2$, i.e., $(V_1+V_2)/2$, relative to the emitter 81 is high enough to make the emitter 81 emit electrons by field emission. Thus, the emitter 81 emits electrons. When the potential difference between the emitter 81 and the gate electrode 86 is V. then, electrons emitted from the emitter 81 have kinetic energy of e V, where e is the absolute value of the charge of electrons.

The blocker 87 is biased negatively relative to the emitter 81. Then, electron waves emitted from the emitter 81 are divided into an electron wave traveling over the blocker 87 and an electron wave traveling under the blocker 87, as viewed in FIG. 14, by the blocker 87.

When the potential of the collector 82 is lower than the potential V of the gate electrode 86 by $\Delta V$, the electrons emitted from the emitter 81 are decelerated and hence the kinetic energy of the electrons is reduced accordingly to $e(V-\Delta V)$.

Figure 14:
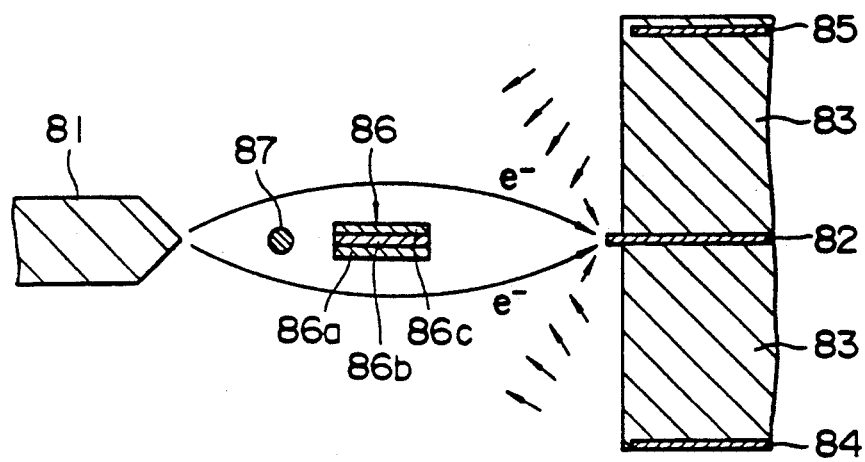
FIG. 14 is a sectional view of a quantum phase interference transistor in a fourth embodiment according to the present invention.

The potentials of the external electrodes 84 and 85 are lower than that of the collector 82 and, consequently, the electrons traveling over and under the gate electrode 86 are subjected to force acting in directions indicated by arrows in FIG. 14, so that the electrons are collected efficiently by the collector 82.

The phase difference between the electron waves divided by the blocker 87 is controlled by the gate electrode 86 for transistor action.

A method of fabricating the quantum phase interference transistor in this embodiment will be described hereinafter.

The emitter 81, the gate electrode 86 and the blocker 87 can be formed by an epitaxial growth process or a dry etching process.

Figure 15:
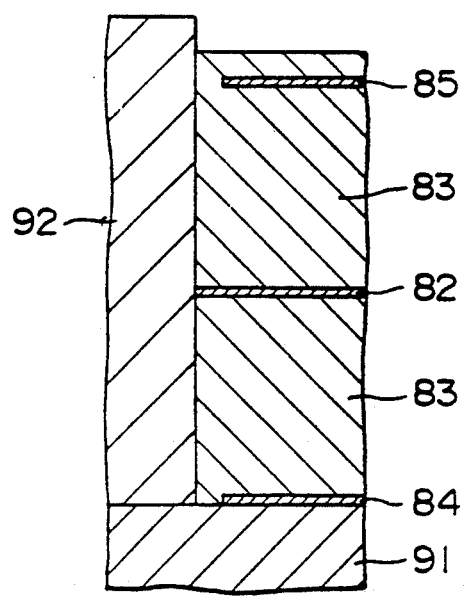
FIG. 15 is a fragmentary sectional view of assistance in explaining a method of fabricating the quantum phase interference transistor shown in FIG. 14.

The collector 82 and the external electrodes 84 and 85 can be formed by the following process. Referring to FIG. 15, a metal thin film is formed on a substrate 91, such as a semi-insulating GaAs substrate, by a vacuum evaporation process or a sputtering process, and then the metal thin film is etched in a predetermined pattern to form the lower external electrode 84. Then, a resist film 92 of a predetermined pattern is formed by lithography, and an insulating layer 83 is formed in an opening in the resist film 92. After forming a metal thin film over the insulating layer 83, the metal thin film is etched in a predetermined pattern to form the collector 82. After forming another insulating layer 83 over the collector 82, the upper external electrode 85 is formed on the insulating layer 83 by the foregoing method.

Then, the resist film 92 is removed and the insulating layer 83 is etched lightly by an wet etching process. Of the insulating film 83 is a $SiO_2$ film, a hydrofluoric acid etching liquid is used.

Thus, the quantum phase interference transistor as shown in FIG. 14 is fabricated.

As stated above, since the electrons emitted from the emitter 81 are decelerated before the electrons reach the collector 82, the kinetic energy of the electrons on the collector 82 is lower than the kinetic energy of the same immediately after being emitted from the emitter 81 and hence the wavelength of the electron waves can be increased accordingly. Furthermore, since the collector 82 is a metal thin film, the collector 82 can be formed in a very small width in a plane including the path of electrons between the emitter 81 and the collector 82 on the order of several tens angstroms. Accordingly, only one maximum in an interference pattern produced by the interference between the electron wave traveling over the gate electrode 86 to the collector 82 and the electron wave traveling under the gate electrode 86 can be measured by the collector 82, and the variation of the interference pattern of the electron waves caused by phase control can efficiently be used as the variation of collector current.

Since the gate electrode 86 has the construction of a parallel flat capacitor, the potentials of spaces over and under the gate electrode 86 can be maintained constant. Therefore, there is no potential difference between the electron paths respectively extending over and under the gate electrode 86 and hence the efficiency of modulation of the quantum-mechanical transition probability of electrons traveling from the emitter 81 to the collector 82 is satisfactorily high.

Furthermore, since the gate electrode 86 can be formed in a very small thickness, the curvature of the electron paths between the emitter 81 and the collector 82 need not be very large and hence the electrons emitted from the emitter 81 can be collected at a high collection efficiency by the collector 82.

Still further, since electrons travel through a vacuum, the quantum phase interference transistor in this embodiment is capable of operating at a room temperature.

The collector 82 formed of a metal thin film may be substituted by a collector formed of a thin film of a conductive material other than the metal.

The gate electrode 86 need not necessarily of the construction of a parallel flat capacitor.

A quantum phase interference transistor in a fifth embodiment according to the present invention will be described hereinafter.

Figure 16:
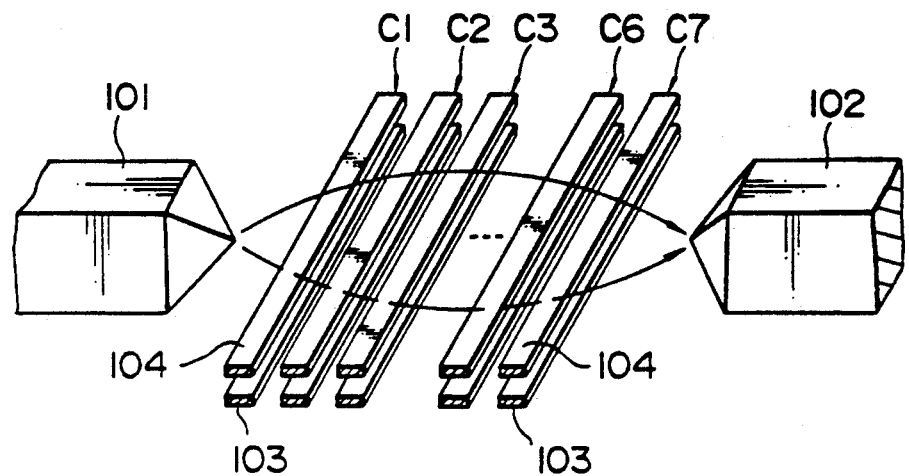
FIG. 16 is a perspective view of a quantum phase interference transistor in a fifth embodiment according to the present invention.
Figure 17:
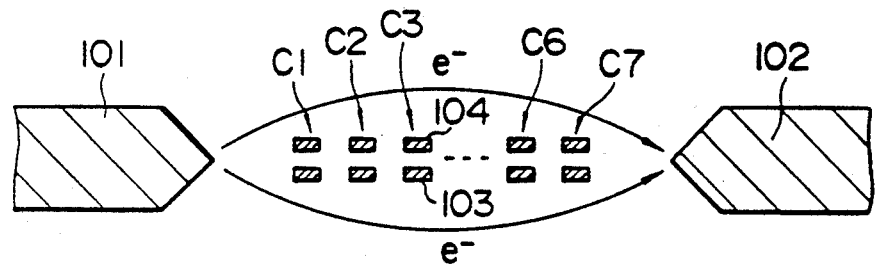
FIG. 17 is a sectional view of the quantum phase interference transistor shown in FIG. 16.

FIG. 16 is a perspective view of the quantum phase interference transistor in this embodiment, and FIG. 17 is a sectional view taken on line 102—102 in FIG. 16.

Referring to FIGS. 16 and 17, the quantum phase interference transistor in this embodiment has an emitter 101 and a collector 102 formed opposite to each other on a substrate, not shown. The emitter 101 and the collector 102 have the shape of, for example, a quadrangular prism having a point having the shape of a quadrangular pyramid. The emitter 101 and the collector 102 may be formed of a conductive material, such as a semiconductor or a metal. A portion having the shape of a quadrangular prism of each of the emitter 101 and the collector 102 has a cross section of, for example, about 0.5 $\mu m \times 0.5$ $\mu m$.

Seven parallel flat capacitors C1 to C7 are arranged in parallel to each other between the emitter 101 and the collector 102 with their lengths perpendicular to a line connecting the emitter 101 and the collector 102. Indicated at 103 and 104 are the electrodes of the parallel flat capacitors C1 to C7. The electrodes 103 and 104 are supported at their opposite ends on supports, not shown, so that the electrodes 103 and 104 are in suspension. The electrodes 103 and 104 are formed of, for example, aluminum (Al). The widths of the parallel flat capacitors C1 to C7 and intervals between the same with respect to a direction along the line connecting the emitter 101 and the collector 102 are, for example, on the order of several hundreds angstroms.

The parallel flat capacitors C1 to C7 inclusively serve as a gate electrode, in which, for example, the parallel flat capacitor C1 serves as a blocker, and the parallel flat capacitor C2 serves as a pulling-out electrode.

The respective potentials $V_{Cm}$(lower) and $V_{Cm}$(upper) of the electrodes 103 and 104 of the parallel flat capacitors C1 to C7 (hereinafter represented by Cm, where m=1 to 7) are determined so as to meet the following conditions.

A predetermined voltage is applied across the emitter 101 and the collector 102 so that the potential of the collector 102 is higher than that of the emitter 101. The electrodes 103 and 104 of the parallel flat capacitors C1 and C2, i.e., the blocker and the pulling-out electrode, are equipotential, namely, $V_{C1}$(lower)=$V_{C1}$(upper) and $V_{C2}$(lower)=$V_{C2}$(upper), to make the emitter 101 emit electrons. The values of $V_{C1}$(lower)=$V_{C1}$(upper) and $V_{C2}$(lower)=$V_{C2}$(upper) are determined so that electron waves emitted from the emitter 102 are divided into an electron wave traveling over the parallel flat capacitor C1 and an electron wave traveling under the parallel flat capacitor C1 as viewed in FIGS. 16 and 17, and the electron waves converge satisfactorily on the collector 102. In this state, no voltage is applied across the electrodes 103 and 104 of the other parallel flat capacitors C3 to C7.

After thus determining the potentials of the electrodes 103 and 104 of the parallel flat capacitors C1 and C2, the potentials of the other five parallel flat capacitors C3 to C7 are determined so that the potential distribution between the emitter 101 and the collector 102 is not disturbed, and the electrodes 103 and 104 of the parallel flat capacitors C3 to C7 are equipotential, namely, $V_{Cm}$(lower)=$V_{Cm}$(upper) (m=3 to 7).

In this state, potentials of the electrodes 103 and 104 of the parallel flat capacitors C1 to C7 are changed, for example, $V_{Cm}$(lower)→$V_{Cm}$(lower)−$\Delta V/2$, and $V_{Cm}$(upper)→$V_{Cm}$(upper)+$\Delta V/2$ (m=1 to 7). Then, the potential difference between the electrodes 103 and 104 of the parallel flat capacitors C1 to C7 is $\Delta V$. Consequently, a phase difference according to the potential difference $\Delta V$ appears between the electron waves respectively traveling over and under the parallel flat capacitors C1 to C7. The potential difference $\Delta V$ is varied to control the phase difference between the electron waves for transistor action.

As mentioned above, the average potentials of the electrodes 103 and 104 of the parallel flat capacitors C1 to C7 are maintained at the optimum potentials even if the potential $V_{Cm}$(upper) and $V_{Cm}$(lower) are changed respectively by $\pm \Delta V$.

A method of fabricating the quantum phase interference transistor in this embodiment will be described hereinafter.

First, the emitter 101 and the collector 102 are formed by an epitaxial growth process or a dry etching process, and then the parallel flat capacitors C1 to C7 are formed by the following processes.

Figure 18:
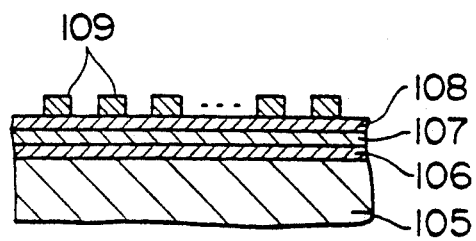
FIG. 18 is a sectional view of assistance in explaining a method of fabricating the quantum phase interference transistor shown in FIG. 16.

Referring to FIG. 18, a $SiO_2$ film 105, an Al film 106, A $SiO_2$ film 107 and an Al film 108, for instance, are formed sequentially in that order on a substrate, not shown. The $SiO_2$ films 105 and 107 may be formed by a CVD process or a sputtering process.

The substrate is placed in the evacuated cheer of an electron beam irradiation system, not shown, and then a source gas, such as alkylnaphthalene gas, is supplied into the evacuated cheer. Molecules of the source gas are adsorbed by the Al film 108. Then, the surface of the Al film 108 is irradiated with a very narrow electron beam in a pattern corresponding to the pattern of the parallel flat capacitors C1 to C7 in the atmosphere of the source gas. Portions of the molecules of the source gas on the Al film 108 irradiated with the electron beam are decomposed to form a resist film 109 of an amorphous hydrocarbon in a pattern corresponding to the pattern of the parallel flat capacitors C1 to C7. Such a resist produced by irradiation with an electron beam is called an EBIR (electron beam induced resist), which is highly resistant to dry etching.

Then, the Al film 108, the SiO₂ film 107 and the Al film 106 are etched sequentially by, for example, a reactive ion etching process (RIE process) using the resist film 109 as a mask, and then the resist film 109 is removed. Then, the SiO₂ films 105 and 107 are etched by wet etching using, for example, a hydrofluoric acid etching liquid. Thus, the parallel flat capacitors C1 to C7 supported in suspension at their opposite ends are formed to complete the quantum phase interference transistor.

The quantum phase interference transistor in this embodiment makes electrons converge satisfactorily on the collector 102 by optimizing the potentials of the electrodes 103 and 104 of the parallel flat capacitors C1 to C7 and thereby the current that flows between the emitter 101 and the collector 102 can be increased. The use of the parallel flat capacitors C1 to C7 as a gate electrode increases the efficiency of the modulation of the quantum-mechanical transition probability of electrons traveling from the emitter 101 to the collector 102 to a satisfactory extent. Furthermore, the quantum phase interference transistor in this embodiment is capable of operating at a room temperature because the electrons travel through a vacuum.

Since the parallel flat capacitors C1 to C7 can be formed in a very small thickness, the curvature of paths along which the electrons travel from the emitter 101 to the collector 102 need not be very large and hence the electrons emitted from the emitter 101 can be collected at a high collection efficiency.

Although the quantum phase interference transistor in this embodiment is provided with the seven parallel flat capacitors C1 to C7 between the emitter 101 and the collector 102, a quantum phase interference transistor in accordance with the present invention may be provided with any optional number of parallel flat capacitors and the number of parallel flat capacitors may be determined as occasion demands. However, in general, it is preferable that the quantum phase interference transistor is provided with a greater number of parallel flat capacitors to optimize the potential distribution between the emitter 101 and the collector 102, and it is preferable to arrange parallel flat capacitors of smaller width at smaller intervals.

Although the quantum phase interference transistor in this embodiment uses the parallel flat capacitors C1 and C2 among the parallel flat capacitors C1 to C7 respectively as a blocker and a pulling-out electrode, it is possible to determined the uses of the parallel flat capacitors C1 to C7 as occasion demands; for example, it is possible to use the parallel flat capacitors C1 and C2 as blockers, and to use the parallel flat capacitors C3 and C4 as pulling-out electrodes.

Furthermore, although the electrodes 103 and 104 of the parallel flat capacitors C1 to C7 are formed of aluminum, naturally, the electrodes 103 and 104 may be formed of a nonmetallic conductive material or a metal other than aluminum.

As is apparent from the foregoing description, the quantum phase interference transistor in accordance with the present invention is provided with the plurality of parallel flat capacitors in a parallel arrangement between the emitter and the collector, and hence the quantum phase interference transistor is capable of operating at a room temperature at a high modulation efficiency, and improves the convergence of electrons on the collector to increase the current flowing between the emitter and the collector.

A selective deposition process in a sixth embodiment according to the present invention will be described hereinafter with reference to FIGS. 19A to 19E.

Referring to FIGS. 19A, first, a pair of electrodes 111 and 112 each having the shape of a quadrangular prism and a pointed tip are formed on a substrate, not shown, so that the respective pointed tips of the electrodes 111 and 112 face each other. The pointed tips of the electrodes 111 and 112 have the shape of, for example, a quadrangular pyramid. The electrodes 111 and 112 may be formed by a dry etching process or an epitaxial growth process. The electrodes 111 and 112 may be formed of a semiconductor, such as GaAs, or a metal, such as tungsten.

Although dependent on the distance between the electrodes 111 and 112, ordinarily, a considerably high voltage must be applied across the electrodes 111 and 112 to cause electron emission if the tips of the electrodes 111 and 112 are simply pointed.

Then, the substrate provided with the electrodes 111 and 112 are placed in a vacuum vessel and a source gas containing a substance to be deposited on the electrodes 111 and 112 is supplied into the vacuum vessel. Consequently, the electrodes 111 and 112 adsorb molecules of the material to form layers 113 of molecules of the material respectively over the surfaces of the electrodes 111 and 112 as shown in FIG. 19B. Then, a sufficiently high voltage $V_1$ is applied across the electrodes 111 and 112 to cause electric discharge, so that electrons ($e^-$) are emitted from the pointed tip of the electrode 111 of a lower potential and the electrons are collected on the electrode 112 of a higher potential. The electrons tend to be concentrated on the pointed tip of the electrode 112 where the intensity of the electric field is the highest.

The electrons impinging against the layer 113 of adsorbed molecules deposited on the pointed tip of the electrode 112 decomposes the molecules and, consequently, a layer 114 of a substance produced by the decomposition of the molecules is formed selectively over the pointed tip of the electrode 112 as shown in FIG. 19C. The thickness of the layer 114 of the substance is greater at a position where the number of the electrons impinging thereon is larger. Since the number of the electrons impinging on the extremity of the pointed tip of the electrode 112 is the largest and the number of the electrons impinging on the electrode 112 decreases with the distance from the extremity of the pointed tip, the layer 114 of the substance has a pointed shape sharper than the pointed tip of the electrode 112.

Since the distance between the electrodes 111 and 112 decreases as the sharp layer 114 of the substance grows on the tip of the electroder 112, the voltage V necessary for causing electric discharge between the electrodes 111 and 112 decreases from the voltage $V_1$ necessary for initiating electric discharge before the layer 114 of the substance is formed. Therefore, the voltage $V_1$ is decreased to a voltage $V_2$ lower than the voltage $V_1$ to continue electric discharge across the electrodes 111 and 112 after the layer 114 of the substance has been formed. When electric discharge is continued by applying the voltage $V_2$ across the electrodes 111 and 112, the layer 114 of the substance is grown further and the sharpness of the tip of the layer 114 of the substance increases as shown in FIG. 19D. Consequently, the voltage V applied across the electrodes 111 and 112 is reduced still further.

Thus, the voltage applied across the electrodes 111 and 112 is decreased gradually while the layer 114 of the substance continues to grow. The application of the voltage V across the electrodes 111 and 112 is stopped to complete the deposition of the layer 114 of the substance upon the growth of the layer 114 of the substance in a desired thickness and a desired shape.

If the application of the voltage across the electrodes 111 and 112 is continued, the layer 114 of the substance grows gradually toward the tip of the electrode 111 and, finally, the layer 114 of the substance reaches the tip of the electrode 111 to connect the respective tips of the electrodes 111 and 112 by the layer 114 of the substance as shown in FIG. 19E. In the state shown in FIG. 19E, the layer 114 of the substance has the shape of an elongate column having a diameter far smaller than the size of the sections of the electrodes 111 and 112. Thus, the layer 114 of the substance form a fine line having a very small diameter and supported at its opposite ends in suspension on the electrodes 111 and 112.

If a material containing, for example, a Cs compound is used for forming the layer 114 of the substance, the layer 114 is formed of Cs. Thus, an electron emitting source capable of emitting electrons at a high efficiency can be formed.

If a semiconductor compound is used for forming the layer 114, a fine semiconductor line supported at its opposite ends in suspension on the electrodes 111 and 112 can be formed.

The selective deposition process grows the layer 111 of the substance selectively on the tip of the electrode 112 by applying a voltage across the electrodes 111 and 112 for electric discharge in the atmosphere of the source gas. Therefore, an electron emitting source capable emitting electrons at a high efficiency can readily be formed by depositing, for example, a Cs layer as the layer 114. Furthermore, a fine line having a very small diameter and supported at its opposite ends in suspension on the electrodes 111 and 112 can be formed by continuing the deposition process until the tips of the electrodes 111 and 112 are connected by the layer 114.

A selective deposition process in a seventh embodiment according to the present invention will be described hereinafter as applied to forming a microsolenoid.

Figure 20:
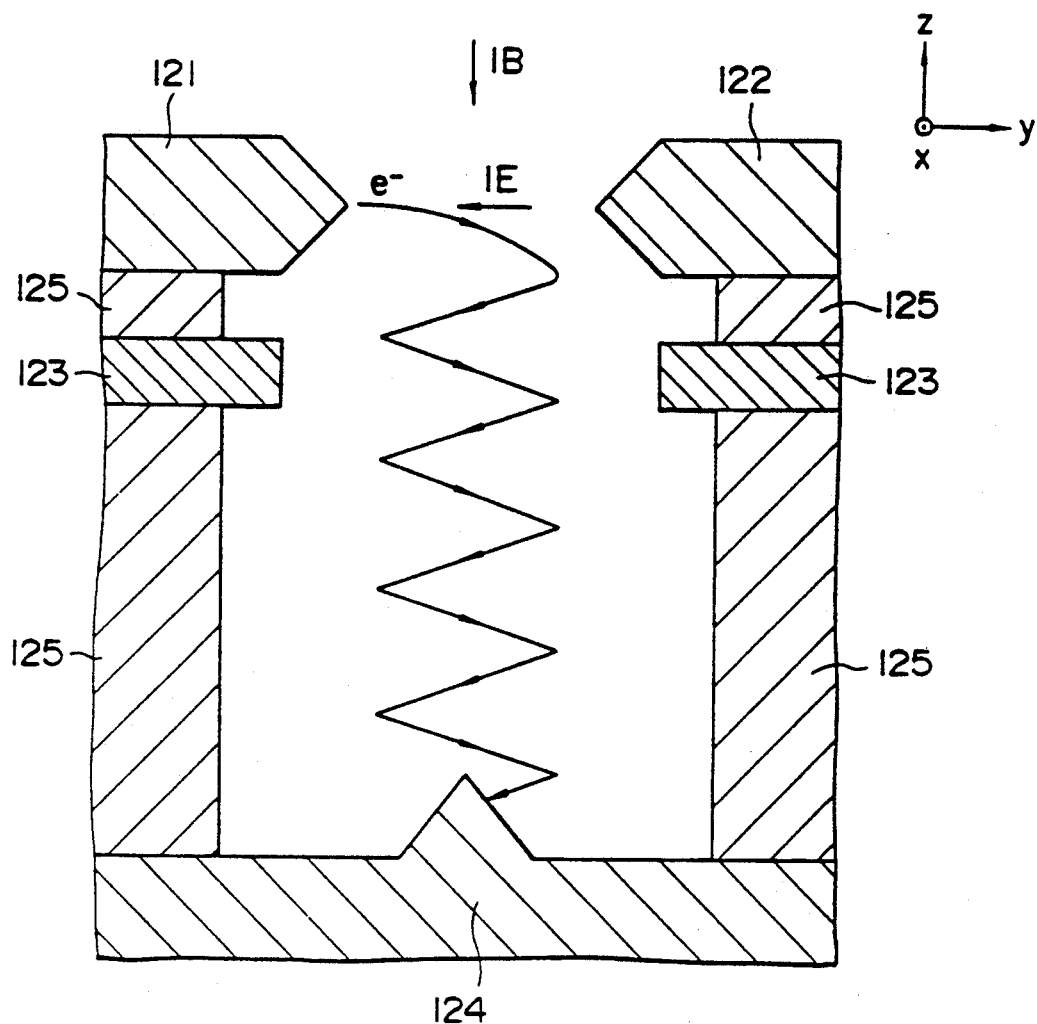
FIG. 20 is a sectional view of assistance in explaining application of the sixth embodiment shown in FIGS. 19A to 19E to forming a microsolenoid in a seventh embodiment according to the present invention.

First, a structure as shown in FIG. 20 is formed on a substrate, not shown, by a dry etching process or an epitaxial growth process. In FIG. 20, indicated at 121 and 122 are a pair of electrodes similar to the electrodes 111 and 112 employed in the sixth embodiment, at 123 is an intermediate electrode, at 124 is a lower electrode, and at 15 is an insulating layer.

The substrate provided with the structure shown in FIG. 20 is placed in a vacuum vessel and a source gas is supplied into the vacuum vessel. A voltage is applied across the electrodes 121 and 122 in a fixed magnetic field B of a direction along the z-axis (FIG. 20) so that, for example, the potential of the electrode 121 is lower than that of the electrode 122 to make the electrode 121 emit electrons from its tip. When an electric field E created between the electrodes 121 and 122 is perpendicular to the magnetic field B, Lorentz's force acts on the electrons emitted from the tip of-the electrode 121 in a direction perpendicular to both the electric field E and the magnetic field B to make the electrons revolve.

When the intermediate electrode 123 is biased so that its potential is higher than that of the electrode 121, the electrons emitted from the tip of the electrode 121 are urged downward as viewed in FIG. 20. Thus, the electrons spiral downward about the z-axis, and then, if the lower electrode 124 is biased so that its potential is far higher than that of the electrode 121, electrons impinge against the lower electrode 124.

Figure 21:
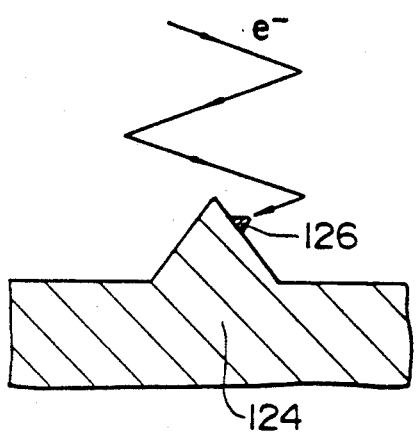
FIG. 21 is a fragmentary sectional view of assistance in explaining the seventh embodiment of the present invention shown in FIG. 20.

Then, molecules of a material adsorbed by the lower electrode 124 are decomposed by the electrons to grow a layer 126 of a substance produce by the decomposition of the material on the lower electrode 124 as shown in FIG. 21. The layer 126 of the substance has a pointed shape corresponding to the distribution of the electrons impinging against the lower electrode 124.

Figure 22:
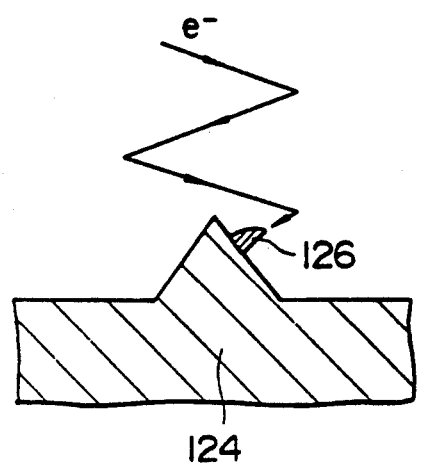
FIG. 22 is a fragmentary sectional view of assistance in explaining the seventh embodiment of the present invention shown in FIG. 20.

When the layer 126 of the substance is deposited in a pointed shape on the lower electrode 124, the intensity of the electric field in the vicinity of the layer 126 of the substance increases and hence the electrons tend to collect on the tip of the layer 126 of the substance. The layer 126 of the substance grows along the path of the electrons in a direction reverse to the direction of movement of the electrons as shown in FIG. 22.

Figure 23:
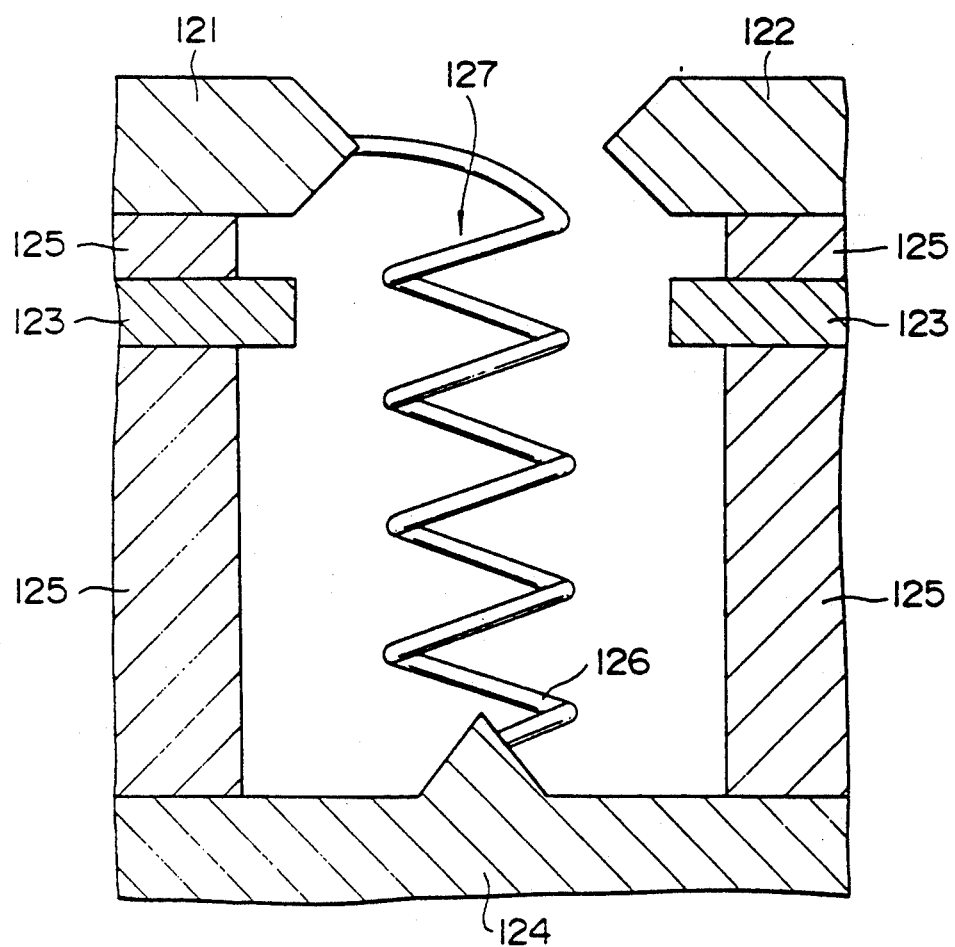
FIG. 23 is a sectional view of assistance in explaining the seventh embodiment of the present invention shown in FIG. 20.

Such a process is continued until the tip of the layer 126 of the substance reaches the tip of the electrode 121 to form a layer 126 of the substance having a very small diameter in a microsolenoid 127 as shown in FIG. 23.

The magnitude of the magnetic field B of a direction along the z-axis is determined in the following manner. The motion of the electron is expressed by equation of motion: $eVB = mv^2/r$, where 3 is the absolute value of the charge of the electron, m is the mass of the electron, and v is the velocity of the electron. The kinetic energy K of the electron emitted from the electrode 121 is expressed by: $K = mv^2/2$. From those expressions, $B = (2mK)^{\frac{1}{2}}/er$. When $r \sim 1$ μm and $K \sim 1$ eV, $B \sim 10$ T.

A selective deposition process in an eighth embodiment according to the present invention will be described hereinafter as applied to fabricating a quantum phase interference transistor using the Aharonov-Bohm magnetic field effect.

Figure 24A:
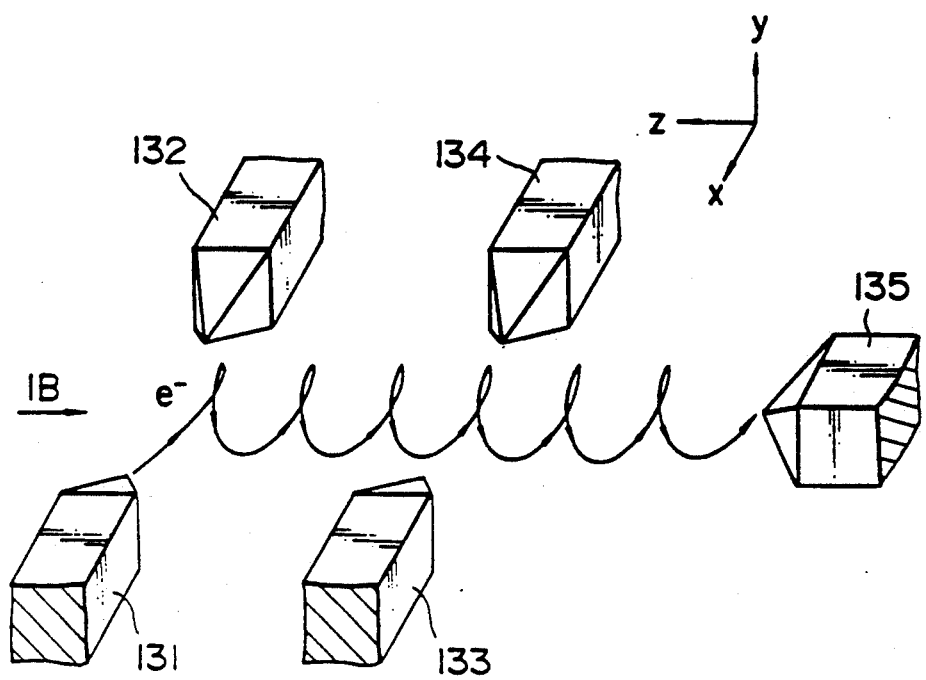
FIGS. 24A and 24B are perspective views of assistance in explaining an eighth embodiment of the present invention.
Figure 24B:
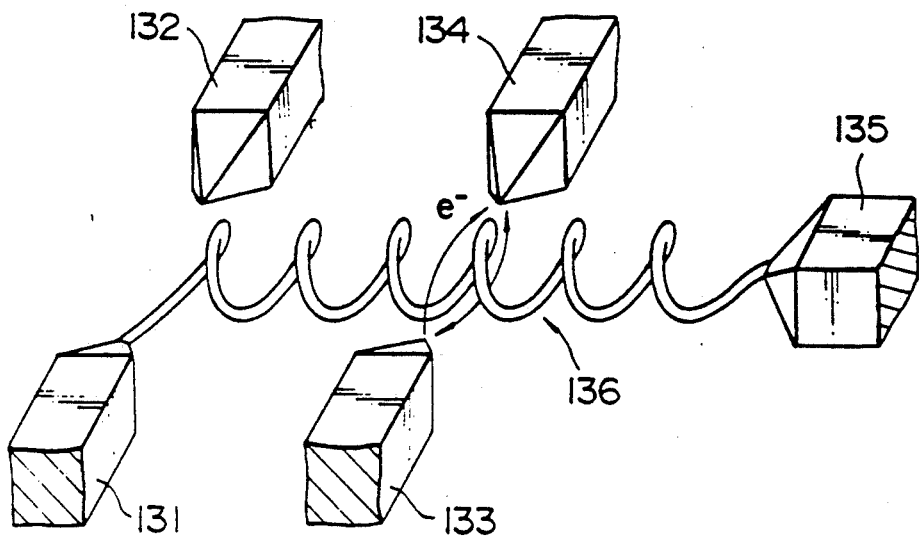

First, five electrodes 131, 132, 133, 134 and 135 respectively having pointed tips are formed on a substrate, not shown, as shown in FIG. 24A by a dry etching process or an epitaxial growth process. The electrodes 131 and 132, and the electrodes 133 and 134 are disposed with their pointed tips facing each other. The electrode 135 is formed so that its pointed tip is directed toward the middle between the electrodes 131 and 132, and the middle between the electrodes 133 and 134.

A microsolenoid is formed between the electrodes 131 and 135 by a process similar to that employed in the seventh embodiment. The substrate provided with the electrodes 131, 132, 133, 134 and 135 is placed in a vacuum vessel, a source gas is supplied into the vacuum vessel, and a voltage is applied across the electrodes 131 and 132 so that the potential of the electrode 131 is lower than that of the electrode 132 with a fixed magnetic field B applied thereto along the z-axis to make the electrode 131 emit electrons from its tip. If the electrode 135 is biased so that its potential is higher than that of the electrode 131, the electrons spiral about the z-axis toward the electrode 135 and impinge against the tip of the electrode 135. Then, molecules of a material adsorbed by the tip of the electrode 135 are decomposed to deposit a substance produced by the decomposition of the material in a layer, not shown, selectively on the tip of the electrode 135.

The layer of the substance grows in a direction reverse to the direction of movement of the electrons along a path between the electrodes 131 and 135. This process is continued until the layer of the substance reaches the tip of the electrode 131. Thus, a microsolenoid 136 of a fine wire having a very small diameter is formed between the electrodes 131 and 135 to complete a desired quantum phase interference transistor.

The operation of the quantum phase interference transistor fabricated by the process in the eighth embodiment will be described hereinafter.

The microsolenoid 136 is biased negatively relative to, for example, the electrode 133, and a voltage is applied across the electrodes 133 and 134 so that the potential of the electrode 133 is lower than that of the electrode 134 to make the electrode 133 emit electrons from its tip. The electrons emitted from the tip of the electrode 133 is divided by the microsolenoid 136 into those traveling over the microsolenoid 136 and those traveling under the microsolenoid 136, that is, electron waves emitted from the tip of the electrode 133 are divided into an electron wave traveling over the microsolenoid 136 and an electron wave traveling under the microsolenoid 136.

On the other hand, a current I is supplied to the microsolenoid 136 to produce magnetic flux $\phi = \mu_0 nIS$, where $\mu_0$ is the space permeability, n is the number of coils per unit length of the microsolenoid 136, and S is the sectional area of the microsolenoid 136. The magnetic flux $\phi$ changes the respective phases of the electron wave traveling over the microsolenoid 136 and the electron wave traveling under the microsolenoid 136 in reverse directions, respectively, by $e\phi/(h/2\pi)$. Thus, the phases of the electron waves are controlled by controlling the current I supplied to the microsolenoid 136 to turn on and off the current flowing between the electrodes 133 and 134.

The magnetic field B used in forming the microsolenoid 136 is 6.7 T when (the energy of the electrons emitted from the electrode 131)~1 eV and (the radius of the microsolenoid 136)~0.5 µm. If the number n of coils of the microsolenoid 136 is several turns per 1 µm, the current I that must be supplied to the microsolenoid 136 to turn off the quantum phase interference transistor is determined by the following manner. When the phase difference between the electron wave traveling over the microsolenoid 136 and the electron wave traveling under the microsolenoid 136 is $\pi$, the quantum phase interference transistor is turned off; that is, the quantum phase interference transistor is turned off when the change in the phase of the electron waves is $\pi/2$. Accordingly, from an expression: $e\phi/(h/2\pi) = e\mu_0 nIS/(h/2\pi) = \pi/2$, $I \sim 10^{-9}$ A = 1 nA.

Thus, the selective deposition process in the eighth embodiment is capable of readily fabricating the quantum phase interference transistor that controls the phases of the electron waves by the microsolenoid 136 formed between the electrodes 131 and 135.

In the quantum phase interference transistor fabricated by the eight embodiment is able to change the phases of the electron waves by the same phase angle even if the energy of the electrons emitted from the tip of the electrode 133 is not constant, and hence the modulation efficiency of the quantum phase interference transistor is high. Accordingly, whereas the prior art quantum phase interference transistor must be operated at a very low temperature, the quantum phase interference transistor fabricated by the eighth embodiment is capable of operating at a far higher temperature, such as a room temperature.

Although the present invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. A quantum phase interference transistor comprising: an emitter for emitting electron waves into a vacuum; a gate electrode for controlling the phase difference between a plurality of electron waves; and a collector for collecting the plurality of electron waves;

characterized in that the collector is formed of a thin film.

* * * * *